(12) United States Patent
Schreiber et al.

(10) Patent No.: US 7,523,549 B1
(45) Date of Patent: Apr. 28, 2009

(54) DIMENSIONALLY STABILIZED FLEXIBLE CIRCUIT FABRICATION METHOD AND PRODUCT

(75) Inventors: Christopher Schreiber, Temecula, CA (US); Chris Dunn, Temecula, CA (US)

(73) Assignee: Magnecomp Corporation, Temecula, CA (US)

( * ) Notice: Subject to any disclaimer, the term of this patent is extended or adjusted under 35 U.S.C. 154(b) by 354 days.

(21) Appl. No.: 11/125,281

(22) Filed: May 9, 2005

Related U.S. Application Data

(60) Provisional application No. 60/671,737, filed on Apr. 15, 2005.

(51) Int. Cl.
*H05K 3/02* (2006.01)

(52) U.S. Cl. .............................. 29/847; 29/831; 29/846; 216/13; 216/36; 216/49; 216/54; 216/100

(58) Field of Classification Search ................ 174/256, 174/254; 438/584; 428/209, 458; 360/245.9; 29/829, 831, 846, 847; 216/13, 20, 33–36, 216/41, 49, 54, 83, 96, 100
See application file for complete search history.

(56) References Cited

U.S. PATENT DOCUMENTS

| | | | |
|---|---|---|---|
| 4,638,400 A * | 1/1987 | Brown et al. ................ 361/304 |
| 4,894,015 A | 1/1990 | Stockero et al. | |
| 5,509,200 A | 4/1996 | Frankeny et al. | |
| 5,645,735 A * | 7/1997 | Bennin et al. ................ | 216/22 |
| 5,719,749 A | 2/1998 | Stopperan | |
| 5,791,552 A | 8/1998 | Werther | |
| 6,071,597 A * | 6/2000 | Yang et al. ................... | 428/209 |
| 6,127,250 A * | 10/2000 | Sylvester et al. ............ | 438/584 |
| 6,135,781 A | 10/2000 | Pope et al. | |
| 6,316,289 B1 | 11/2001 | Chung | |
| 6,316,734 B1 * | 11/2001 | Yang .......................... | 174/256 |
| 6,596,184 B1 * | 7/2003 | Shum et al. ................... | 216/13 |
| 6,696,163 B2 * | 2/2004 | Yang ........................... | 428/458 |
| 6,803,092 B2 * | 10/2004 | Pocius et al. ................ | 428/209 |
| 6,818,540 B2 | 11/2004 | Saran et al. | |
| 2002/0114107 A1 * | 8/2002 | Traskos et al. ........... | 360/244.3 |
| 2003/0053258 A1 * | 3/2003 | Dunn et al. .............. | 360/245.9 |

* cited by examiner

*Primary Examiner*—Dean A. Reichard
*Assistant Examiner*—Andargie M Aychillhum
(74) *Attorney, Agent, or Firm*—Intellectual Property Law Offices of Joel Voelzke, APC

(57) ABSTRACT

A method of fabricating a flexible circuit interconnect comprising a conductive pattern on a flexible substrate comprising layers of different components having different coefficients of thermal expansion, including exposing the flexible substrate sequentially to different temperature regimes tending to differentially expand the flexible circuit components, dimensionally stabilizing the flexible substrate with an added stainless steel layer only during said exposing to different temperature regimes, and removing stainless steel of the added layer from the flexible circuit after exposing the flexible circuit.

19 Claims, 2 Drawing Sheets

DIMENSIONALLY STABILIZED FLEXIBLE CIRCUIT FABRICATION METHOD AND PRODUCT

CROSS-REFERENCE TO RELATED APPLICATIONS

This application claims the benefit of U.S. Provisional Application Ser. No. 60/671,737, filed Apr. 15, 2005.

STATEMENT REGARDING FEDERALLY SPONSORED RESEARCH OR DEVELOPMENT

Not Applicable

REFERENCE TO A MICROFICHE APPENDIX

Not Applicable

BACKGROUND OF THE INVENTION

1. Field of the Invention

This invention relates to fabrication of disk drive suspension interconnects having a conductive pattern on a flexible substrate, and more particularly, to dimensionally stabilizing such interconnects during fabrication operations involving thermal and other stresses with a stainless steel layer present or applied for the purpose of fabrication and fully or at least partially removed after fabrication.

2. Description of the Related Art

Flexible circuit interconnects typically comprise a conductive pattern on a flexible substrate comprising various component layers having different coefficients of thermal expansion. Exposure of the flexible substrate sequentially to different temperature regimes tends to differentially expand the components causing physical distortions that militate against achieving the fineness of pitch, e.g. 38 microns needed to sufficiently separate the numerous input/output terminations common in today's electronic devices.

BRIEF SUMMARY OF THE INVENTION

It is an object, therefore, of the invention to provide an improved method of fabricating flexible circuit interconnects, and improved interconnects. It is a further object to block unwanted physical distortions from differential thermal expansion in different components of the flexible circuit interconnect during processing to achieve a finer pitch product. It is a further object to provide during flexible circuit based interconnect processing a dimension-stabilizing layer that is removed after processing, or converted into a ground plane or stiffener.

These and other objects of the invention to become apparent hereinafter are realized in a method of fabricating a flexible circuit interconnect comprising a conductive pattern on a flexible layer comprising components having different coefficients of thermal expansion, including exposing the flexible layer sequentially to temperature regimes tending to differentially expand the flexible circuit components, and temporarily dimensionally stabilizing the flexible layer during the exposure.

In this and like embodiments, typically, the method further includes temporarily attaching a relatively dimensionally stable layer to the flexible layer, such as a stainless steel layer as the relatively dimensionally stable layer, and etching the stainless steel layer from the flexible layer after the exposure to fully or partially remove the stainless steel layer from the flexible layer.

In a further embodiment, the invention method of fabricating a flexible circuit interconnect comprising a conductive pattern on a flexible layer comprising components having different coefficients of thermal expansion, includes exposing the flexible layer sequentially to different temperature regimes tending to differentially expand the flexible layer components, dimensionally stabilizing the flexible layer with an added stainless steel layer only during the exposing to different temperature regimes, and removing the stainless steel from the flexible layer after the exposing of the flexible layer.

In this and like embodiments, typically, there is also included adding a conductive metal layer to the flexible layer to be opposite to the stainless steel layer across the flexible layer, and masking and etching the conductive metal layer to define the conductive pattern on the flexible layer, attaching the flexible layer and the conductive metal layer to the stainless steel layer, and masking and etching the conductive metal layer.

In a still further embodiment, the invention method of fabricating a flexible circuit interconnect comprising a conductive circuit pattern on a flexible layer comprising components having different coefficients of thermal expansion, includes exposing the flexible layer sequentially to different temperature regimes tending to differentially expand the components, dimensionally stabilizing the flexible layer with an added stainless steel layer only during the exposing to different temperature regimes, and at least partially removing the stainless steel from the flexible layer after the exposing of the flexible layer.

In a further embodiment, the invention method of fabricating a flexible circuit interconnect comprising a conductive circuit pattern on a flexible layer includes fixing a dielectric onto a stainless steel substrate, depositing a base metal onto the dielectric, applying a photoresist onto the base metal and configuring the photoresist to define a circuit pattern precursor on the base metal, plating the circuit pattern precursor, etching away nonplated base metal, plating the circuit pattern precursor with conductive metal to form the conductive circuit pattern, applying a photoresist, and etching stainless steel of the substrate from the flexible circuit.

In yet another embodiment, the invention method includes fixing a dielectric onto a stainless steel substrate, attaching a conductor foil/plastic foil laminate to the dielectric, applying a photoresist onto the laminate and configuring the photoresist to define a circuit pattern precursor on the laminate, etching the conductor foil into the circuit pattern precursor, plating the circuit pattern precursor with conductive metal to form a conductive circuit pattern, and etching the stainless steel of the substrate from the flexible layer.

In product terms, in addition to the products of the foregoing method claims, the invention provides a flexible circuit interconnect comprising a conductive pattern on a flexible layer comprising components having different coefficients of thermal expansion to be subject to different dimensional changes during thermal processing, and a flexible circuit dimensionally stabilizing stainless steel layer partially removed from the flexible circuit.

BRIEF DESCRIPTION OF THE SEVERAL VIEWS OF THE DRAWINGS

The invention will be further described in conjunction with the attached drawings in which.

DETAILED DESCRIPTION OF THE INVENTION

Figure 1:
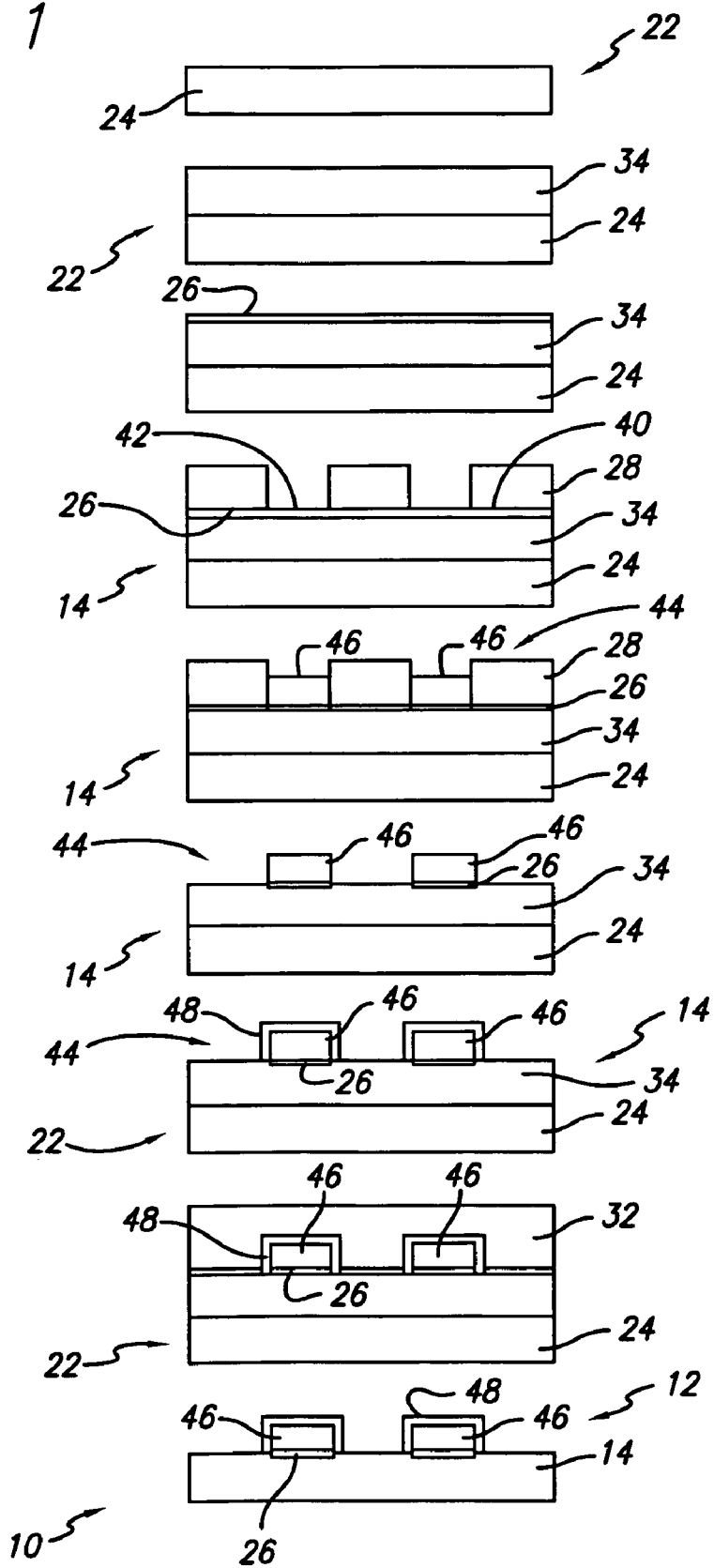
FIG. 1 is a schematic depiction of a flexible circuit preparation additive process using the transitory presence of a stainless steel layer according to the invention.
Figure 2:
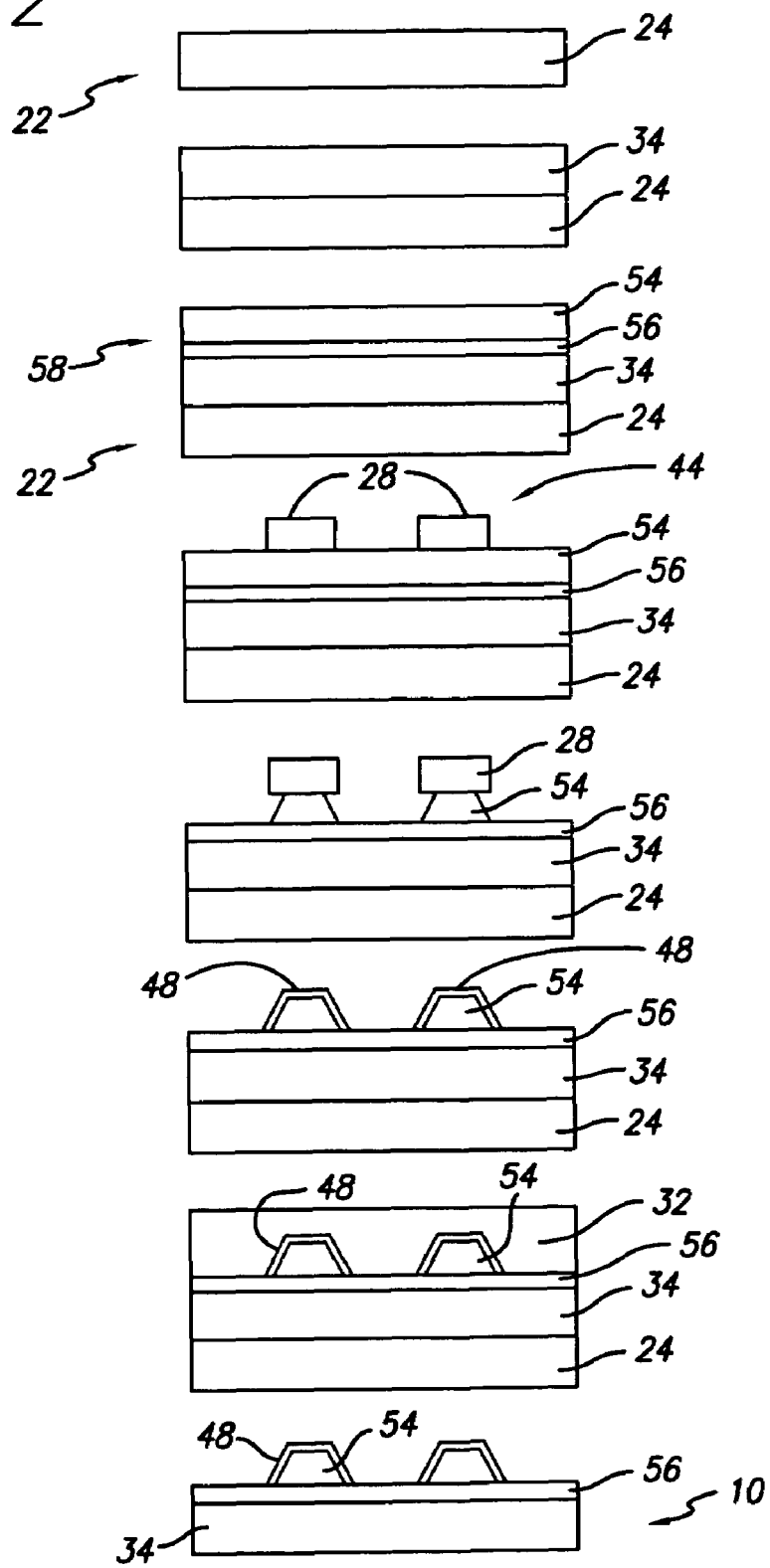
FIG. 2 is a view like FIG. 1 of a flexible circuit preparation subtractive process also using a transitory presence of a stainless steel layer according to the invention.

The invention method adds a stainless steel layer to flexible circuit fabrication processes to create circuits with improved dimensional stability during processing. The majority of currently fabricated flex circuits are made using a polyimide or polyester base layer. A metal layer is then attached to the base layer either through sputtering of a metal layer directly onto the base layer and plating up a circuit pattern through a semi-additive process or through lamination of a metal foil layer to the base layer using an adhesive and subtractively etching circuit feature into the metal foil. Typical processes with the invention dimensional support feature added are shown in FIGS. 1 and 2

Flexible circuits are inherently unstable as they are constructed from thin layers of metal foil and plastic having different coefficients of thermal expansion (CTE's). The numerous thermal and chemical milling operations used in creating these circuits exacerbate problems inherent in the flexible circuit preforms. Portable electronic devices, particularly, have displays with Input/Output (I/O) terminations distributed about the periphery of the device at e.g. a 38-micron pitch. To minimize possible shorting across these numerous I/O's, a severe cumulative tolerance limit is required even in a 2-inch display.

This invention solves the dimensional stability problem during processing by temporarily adding a further layer to the circuit construction, which can provide dimensional stability to the substrate during processing in addition to providing a ground reference plane. An optimal material to use to provide this stability is 15-25 um-thick 300 series stainless steel. This material provides dimensional stability (yield strength=1.1 GPa), is commercial available in roll format and is easily etched using standard PCB etching techniques. The accompanying Figures illustrate simple semi-additive and subtractive circuit process flows that can be used to create flex circuits using a stainless steel layer for dimensional stability during processing. The stainless steel can be fully removed at the very end of circuit processing to create a standard flex circuit construction, or it can be converted, e.g. patterned to create a ground plane or stiffeners on the flex circuit.

With reference now to the drawings, a flexible circuit interconnect is shown at 10 to comprise a conductive circuit pattern 12 on a flexible layer 14 comprising multiple layers of components e.g. 26, 34 having different coefficients of thermal expansion, such as metal, e.g. copper, and plastic, e.g. polyimide or polyester plastics. The method includes exposing the flexible layer 14 sequentially to temperature regimes tending to differentially expand the flexible circuit components 26, 34 in the course of plating and etching operations at different temperature conditions, and temporarily dimensionally stabilizing the flexible layer during the exposure with a relatively dimensionally stable, flex circuit stabilizing layer 22 fixed thereto.

In general, stabilizing layer 22 takes the form of a stainless steel layer 24 temporarily attached to the flexible layer 14. The stainless steel layer 24 is etched from the flexible layer after the processing exposure to fully or partially remove the stainless steel layer from the flexible layer 14.

More particularly, in fabricating a flexible circuit interconnect in accordance with the invention, the method includes exposing the flexible layer 14 of interconnect 10 sequentially to different temperature regimes tending to differentially expand the flexible layer components 26, 34, dimensionally stabilizing the flexible layer with an added stainless steel layer 24 only during the exposing to different temperature regimes, and removing the stainless steel from the flexible layer after the exposing of the flexible layer.

In the embodiment of FIG. 1, particularly, flexible layer 14 is built through a sequence of additions and deletions of materials. Thus, with reference to FIG. 1, the inchoate flexible layer 14 is formed on a substrate of stabilizing layer 22 comprising stainless steel layer 24 by adding in sequence a plastic dielectric layer 34 and a metal layer 26 comprising sputtered conductive base metal to be opposite to the stainless steel layer 24 across the dielectric layer. The base metal layer 26 is then masked with a maskant 28 defining a photoresist pattern covering and exposing different portions 40, 42, respectively, of the base metal layer. The exposed base metal layer portions 42 are plated with a conductor 46 to provide the metal conductor pattern precursor 44. Still exposed parts of the base metal layer 26 are etched away leaving flexible layer 14 comprising circuit pattern 12 defined by remaining parts of base metal layer 26 plated with conductor 46 and disposed on dielectric layer 34. A second maskant 32 is then applied to protect the circuit pattern 12 while the stainless steel layer 24 is removed or partially removed. The stainless steel layer 24 is thus present during temperature differentiated coating and etching operations.

In a preferred embodiment of the method, shown in FIG. 1, the method includes forming a flexible layer 14 of an interconnect 10 by fixing dielectric 34 on a stainless steel substrate 24, depositing base metal 26 onto the dielectric opposite the stainless steel layer across the dielectric layer, applying a photoresist maskant 28 onto the base metal and configuring the photoresist to define inchoate circuit pattern 44 on the base metal, plating the circuit pattern with plating 46, etching away the base metal except in the circuit pattern, further plating the plated, base metal to define circuit pattern 12 with conductive metal 48, applying a second photoresist maskant 32 to protect circuit pattern 12, and etching stainless steel of the substrate 24 from the flexible circuit 14.

Where the stainless steel layer 22 is useful to function as a ground plane or a stiffener, the method includes at least partially removing the stainless steel 24 from the flexible layer 14 after the exposing of the flexible layer. The invention product is then a flexible circuit interconnect 10 comprising a conductive pattern 12 on a flexible layer 14 comprising components 26, 34 having different coefficients of thermal expansion to be subject to different dimensional changes during thermal processing, and a flexible circuit dimensionally stabilizing stainless steel layer 22 partially removed from the flexible circuit, e.g. as an intermediate product in carrying out the method.

With reference to FIG. 2, in a further preferred embodiment, the invention method includes fixing dielectric 34 onto a stabilizing layer 22 comprising a stainless steel substrate 24, attaching a laminate 58 of conductor foil 54 and plastic foil 56, respectively, to the dielectric, applying a photoresist 28 onto the laminate and configuring the photoresist to define a circuit pattern precursor 44 on the laminate, etching the conductor foil 54 into the shape of circuit pattern precursor 44, plating the circuit pattern with conductive metal plating 48, adding a second photoresist 32 and etching stainless steel 24 of the substrate layer 22 from the resultant flexible circuit 10.

The invention thus provides an improved method of fabricating flexible circuit interconnects, and improved interconnects by blocking unwanted physical distortions from differential thermal expansion in different components of the flexible circuit interconnect during processing to achieve a finer pitch product, using a dimension-stabilizing layer, typically of stainless steel, that is removed after processing, or converted by etching into suitable form into a ground plane or a stiffener for the interconnect.

The foregoing objects are thus met.

We claim:

1. A method of fabricating a flexible circuit interconnect comprising a conductive pattern on a flexible layer comprising components having different coefficients of thermal expansion, including:
   temporarily attaching a relatively dimensionally stable layer to said flexible layer to dimensionally stabilize said flexible layer during an exposure to sequential temperature regimes;
   exposing said flexible layer sequentially to temperature regimes tending to differentially expand said flexible circuit components.

2. The method according to claim 1 wherein said relatively dimensionally stable layer comprises stainless steel.

3. A flexible circuit interconnect product produced by the method of claim 1.

4. The method according to claim 1 wherein exposing said flexible layer sequentially to temperature regimes occurs in the course of plating and etching operations.

5. The method according to claim 1 wherein said relatively dimensionally stable layer is flat.

6. A method comprising providing the product produced according to the method of claim 1.

7. The method according to claim 2, including also etching said stainless steel layer from said flexible layer after said exposure.

8. The method according to claim 2, including also partially removing said stainless steel layer from said flexible layer.

9. The method according to claim 2 wherein said stainless steel layer is 15 to 25 microns thick.

10. A method of fabricating a flexible circuit interconnect comprising a conductive pattern on a flexible layer comprising components having different coefficients of thermal expansion, including exposing said flexible layer sequentially to different temperature regimes tending to differentially expand said flexible layer components, dimensionally stabilizing said flexible layer with an added stainless steel layer only during said exposing to different temperature regimes, and removing said stainless steel from said flexible layer after said exposing of said flexible layer.

11. The method according to claim 10, including also adding a conductive metal layer to said flexible layer to be opposite to said stainless steel layer across said flexible layer, and masking and etching said conductive metal layer to define said conductive pattern on said flexible layer.

12. A method comprising providing the product produced according to the method of claim 10.

13. The method according to claim 11, including attaching said flexible layer and said conductive metal layer to said stainless steel layer, and masking and etching said conductive metal layer.

14. A method of fabricating a flexible circuit interconnect comprising a conductive pattern on a flexible layer comprising components having different coefficients of thermal expansion, including exposing said flexible layer sequentially to different temperature regimes tending to differentially expand said components, dimensionally stabilizing said flexible layer with an added stainless steel layer only during said exposing to different temperature regimes, and at least partially removing said stainless steel from said flexible layer after said exposing of said flexible layer.

15. A method of fabricating a flexible circuit interconnect comprising a conductive circuit pattern on a flexible layer, including:
   fixing a dielectric onto a stainless steel substrate; then
   depositing a base metal onto said dielectric;
   applying a photoresist onto said base metal;
   configuring said photoresist to define a circuit pattern precursor on said base metal;
   plating said circuit pattern precursor;
   etching away nonplated base metal to form said circuit pattern;
   plating said circuit pattern with conductive metal; and then
   etching stainless steel of said substrate from said flexible circuit.

16. The method according to claim 15 wherein said fixing comprises forming said dielectric on said stainless steel substrate.

17. A method comprising providing the product produced according to the method of claim 15.

18. A method of fabricating a flexible circuit interconnect comprising a conductive circuit pattern on a flexible layer, including:
   fixing a dielectric onto a stainless steel substrate; then
   attaching a conductor foil/plastic foil laminate to said dielectric;
   applying a photoresist onto said laminate;
   configuring said photoresist to define a circuit pattern precursor on said laminate;
   etching said conductor foil into said circuit pattern precursor;
   plating said circuit pattern with conductive metal to form said conductive circuit pattern; and then
   etching said stainless steel of said substrate from said flexible layer.

19. A method comprising providing the product produced according to the method of claim 18.

* * * * *